United States Patent [19]

Welles, II et al.

[11] Patent Number: 4,560,941

[45] Date of Patent: Dec. 24, 1985

[54] FREQUENCY MODULATION DETECTOR USING DIGITAL SIGNAL VECTOR PROCESSING

[75] Inventors: Kenneth B. Welles, II, Schenectady; Sharbel E. Noujaim, Clifton Park, both of N.Y.

[73] Assignee: General Electric Company, Schenectady, N.Y.

[21] Appl. No.: 653,117

[22] Filed: Sep. 21, 1984

[51] Int. Cl.$^4$ ............................................... H03D 3/00
[52] U.S. Cl. ..................................... 329/50; 329/124; 329/126; 455/214; 375/82
[58] Field of Search ................. 329/50, 122, 124, 126; 455/214; 375/80, 82, 94

[56] References Cited

FOREIGN PATENT DOCUMENTS 2113930  8/1983  United Kingdom ................ 329/124

Primary Examiner—Siegfried H. Grimm

Attorney, Agent, or Firm—Julius J. Zaskalicky; James C. Davis, Jr.; Marvin Snyder

[57] ABSTRACT

A frequency modulated signal is converted into a pair of baseband signals by mixing the signal with a pair of phase-quadrature reference signals of substantially carrier center frequency. The double reference frequency component of each of the baseband signals is filtered to obtain I and Q signals. The I and Q signals constitute in rectangular coordinates the components of a vector represented in polar coordinates by R and $\theta$ where R is the maximum amplitude of the I and Q signals and $\theta$ is the instantaneous angle represented by the arctangent of the I signal divided by the Q signal. The I and Q signals are inverted to provide respective $-I$ and $-Q$ signals. The I, $-I$, Q, $-Q$ signals are sampled to provide a sequence of sets of signal samples. For each set of signal samples the angle $\theta$ is obtained. A sequence of changes in the values of the angle $\theta$ over successive sampling periods is obtained and represents the deviation in frequency of the FM carrier corresponding to changes in amplitude of the modulating signal.

8 Claims, 8 Drawing Figures

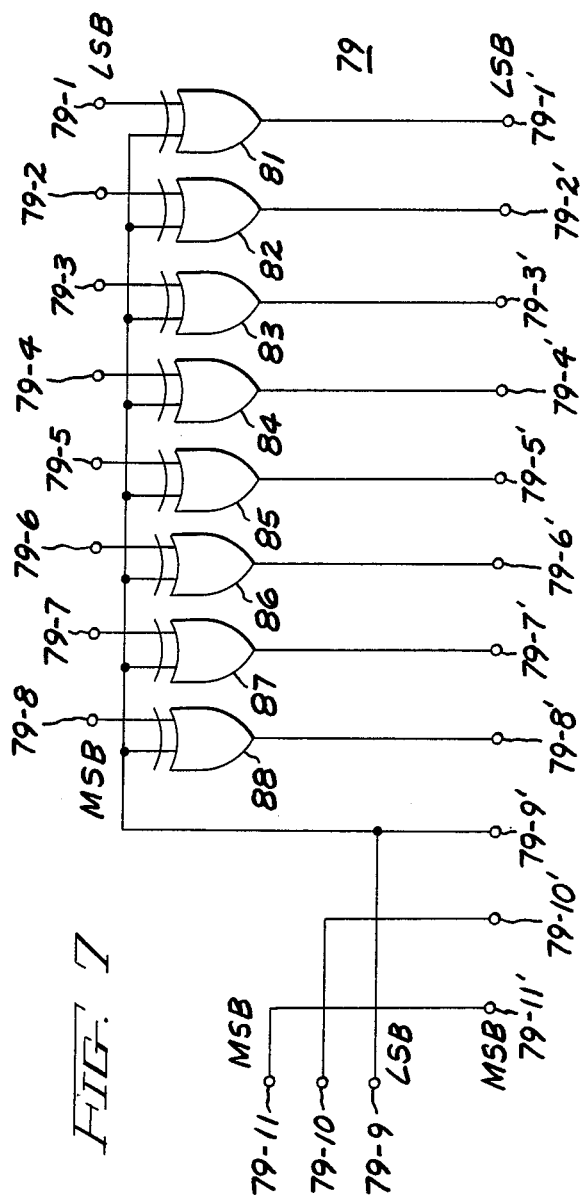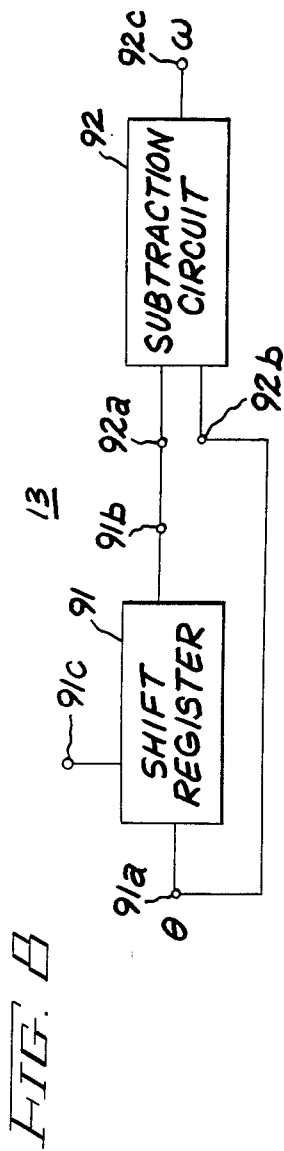
FIG. 7
FIG. 8

FREQUENCY MODULATION DETECTOR USING DIGITAL SIGNAL VECTOR PROCESSING

The present invention relates in general to frequency modulation detectors and in particular to frequency modulation detectors which avoid the use of intermediate frequency (IF) stages.

Conventionally, detection of a frequency modulated (FM) signal is accomplished by reducing the carrier frequency of the FM signal to an intermediate frequency by mixing the signal with a local signal of appropriate frequency. Thereafter, the intermediate frequency signal is amplified in stages of an intermediate frequency channel. The output of the intermediate frequency channel is supplied to a circuit which provides an output which is a function of frequency to recover the signal modulating the FM carrier. A large fraction of the physical volume of an FM radio is used for IF components. Also, the IF components contribute significantly to the cost of the receiver as well.

Te present invention is directed to the detection of FM signls which avoids the use of an intermediate frequency channel.

Another object of the present invention is to provide an FM which can be integrated on a single semiconductor chip.

Another object of the present invention is to provide rejection of amplitude modulation detection in an FM detector.

A further object of the present invention is to provide an FM detector in which as much of the signal processing as possible is performed digitally to render signal processing relatively independent of the variations in components and processes inherent in analog circuitry.

In carrying out the invention in accordance with an illustrative embodiment thereof, in a detector for recovering a modulating signal from a carrier modulated in frequency by the modulating signal, there is provided means for generating first and second signals in phase quadrature at a reference frequency substantially equal to the center frequency of the carrier. Means are also provided responsive to the phase-quadrature reference signals for converting a frequency modulated carrier into respective first and second baseband signals. Means are provided for filtering the double reference frequency components of the first and second baseband signals to provide respective I and Q signals. The I and Q signals constitute in rectangular coordinates a vector represented in polar coordinates by R and $\theta$, where R is the maximum amplitude of the I and Q signals and $\theta$ is the instantaneous angle represented by the arctangent of the I signal divided by the Q signal. Means are provided for inverting the I signal and the Q signal to provide respective $-I$ and $-Q$ signals. Means are provided for sampling the I, $-I$, Q and $-Q$ signals at a frequency greater than twice the maximum deviation in frequency of said carrier produced by said modulating signal to obtain a sequence of sets of samples of the I, $-I$, Q, and $-Q$ signals, each set of samples being represented by a respective vector R and a respective angle $\theta$ consisting of a first angle component equal to zero or an integral number of octants and a second angle component less than an octant which is either added to or subtracted from the first angle component depending on whether the vector R is in an odd or an even octant.

First conversion means are provided responsive to each of the sets of signal samples for providing a respective first binary number 000 to 111 representing the first angle component of a respective angle $\theta$. Second conversion means are provided responsive to each of the sets of signal samples for providing a respective second binary number representing the second angle component of a respective angle $\theta$. Means are provided for combining the first binary number and the second binary number of each of the sets of samples to obtain a respective third binary number representing the respective angle $\theta$ thereof. Means are provided for obtaining a sequence of changes in the value of the third binary numbers of successive sets of the sequence of sets of I, $-I$, Q, and $-Q$ signal samples representing changes in frequency of the carrier from the center frequency thereof corresponding to changes in amplitude of the modulating signal. Means are provided for converting each number of the sequence of changes in the value of third numbers into a respective amplitude level whereby said modulating signal is recovered.

The novel features which are believed to be characteristic of the present invention are set forth with particularity in the appended claims. The invention itself, however, both as to its organization and method of operation, together with further objects and advantages thereof, may best be understood by reference to the following description taken in connection with the accompanying drawings wherein:

FIG. 7 shows a schematic diagram of the combinatorial logic circuit 79 of FIG. 4.

FIG. 8 shows a block diagram of the time derivative circuit of FIG. 1.

Figure 1:
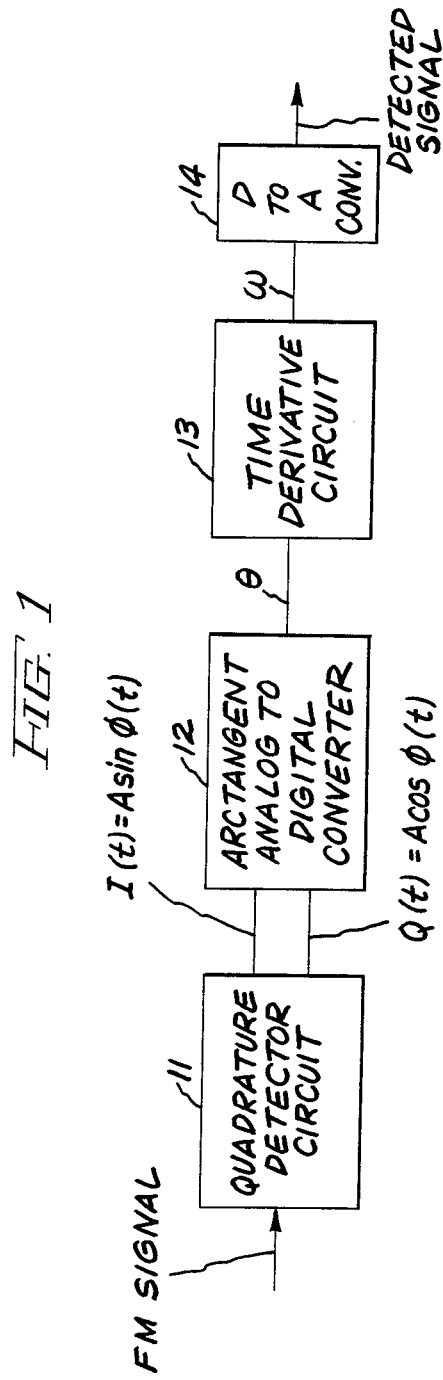
FIG. 1 shows a block diagram of a frequency modulation detector in accordance with the present invention.

A frequency modulated signal S(t) may be represented by the equation:

$$S(t) = A \cos(\omega_c t + \phi(t)), \tag{1}$$

where $\omega_c$ is the carrier frequency, $\phi(t)$ is the phase deviation of the carrier produced by frequency modulation of the carrier and t represents time.

To demodulate the frequency modulated signal, it is necessary to detect the modulation in frequency of the carrier. Conventionally, the detection is accomplished by reducing the carrier frequency of the signal to an intermediate frequency by mixing it with local reference signal of appropriate frequency. Thereafter the intermediate frequency signal is amplified in stages of an intermediate frequency channel. The amplified intermediate frequency signal is then applied to a circuit which provide an output which is a function or frequency to recover the modulating signal.

The modulating signal may also be recovered without the use of an intermediate frequency channel. In this case the frequency modulated signal is reduced to a pair of baseband signals in phase quadrature utilizing a pair of local reference signals of a frequency substantially equal to the center frequency of the carrier and in phase quadrature. The local reference signals $\cos \omega_c t$ and $\sin \omega_c t$ are mixed or multiplied with the frequency modulated carried signal S(t) to produce the signals $$[A \cos (\omega_c t + \phi(t))] \times [\cos \omega_c t] = \tfrac{1}{2}[A \cos \phi(t) + A \cos (2\omega_c t + \phi(t))]. \quad (2)$$

$$[A \cos (\omega_c t + \phi(t))] \times [\sin \omega_c t] = \tfrac{1}{2}[A \sin \phi(t) + A \sin (2\omega_c t + \phi(t))]. \quad (3)$$

The signals of substantially twice reference frequency are filtered to recover the baseband signals:

$$I(t) = A \sin \phi(t) \quad (4)$$

$$Q(t) = A \cos \phi(t) \quad (5)$$

The function $\phi(t)$ includes the modulation of the carrier frequency $\omega_c$.

If the carrier is modulated by a signal having a frequency $\omega_1$ and an amplitude producing a maximum deviation of the carrier frequency of $\Delta\omega_c$, then:

$$\phi(t) = \Delta\omega_c \cos \omega_1 t \text{ and} \quad (6)$$

$$I(t) = A \sin (\Delta\omega_c \cos \omega_1 t) \quad (7)$$

$$Q(t) = A \cos (\Delta\omega_c \cos \omega_1 t) \quad (8)$$

The I(t) and Q(t) functions can be generated by a vector R of length A rotating at a frequency of $\Delta\omega_c \cos \omega_1 t$, where Q(t) is selected as the horizontal coordinate and I(t) is selected as the vertical coordinate of a rectangular coordinate system. To detect one amplitude level of the modulating signal it is simply necessary to divide the difference $(\theta_2 - \theta_1)$ in the angular positions $\theta_1$ and $\theta_2$ of the vector R at two different times $t_1$ and $t_2$ by the period of time $(t_2 - t_1)$ taken by the vector to move from angular position $\theta_1$ to angular position $\theta_2$. The amplitude level of the modulating signal can be accurately determined by making the time interval $(t_2 - t_1)$ smaller than one half the period of a cycle of the maximum deviation frequency. Successive levels of the modulating signal are similarly obtained at successive intervals of time.

The mode of detection of a FM signal described above is utilized in accordance with the present invention. The baseband signals I(t) and Q(t) are derived from the frequency modulated signal. The I(t) and Q(t) signals are sampled at a rate which is large in relation to the maximum frequency deviation produced by the modulating signal as pointed out above. For each set of I(t) and Q(t) samples, a ratio of $I_{sample}/Q_{sample}$ is obtained representing the tangent of the angle $\theta$ of the vector R corresponding to the samples. For the tangent of each set of samples, the angle of the corresponding vector R is obtained. The difference in angular displacement of a pair of successive vectors divided by the period of sampling represents the angular velocity or frequency of the vector and also the amplitude level of the modulating signal during that period. Over successive sampling periods, successive levels of the modulating signal are obtained thereby recovering the modulating signal including the frequency components thereof.

In accordance with another aspect of the present invention, each set of samples of the I(t) and Q(t) signals are processed digitally to provide binary numbers corresponding to the angle $\theta$ of a respective vector R thereof. By obtaining the difference in successive binary numbers, a sequence of binary numbers representing successive levels of the modulating signal is obtained. Conversion of the sequence of binary numbers into a sequence of analog levels recovers the modulating signal.

Reference is now made to FIG. 1 which shows a block diagram of frequency modulation detection apparatus 10 in accordance with the present invention. The apparatus 10 includes a quadrature detector circuit 11 for converting a frequency modulated signal S(t) as set forth in equation (1) to a pair of baseband signals I(t) and Q(t) as set forth in equations (4) and (5), respectively.

The apparatus also includes an arctangent analog-to-digital converter 12 which samples the I(t) and Q(t) signal at a rate which is large in relation to the maximum frequency deviation produced by the modulating signal to produce a sequence of samples. For each set of I(t) and Q(t) samples a respective ratio of the I sample to the Q sample is obtained. Each ratio represents the tangent of the angle coordinate of a respective rotating vector R as described above. For the tangent of each of samples the angle of the corresponding vector R is obtained and provided as a binary number. The apparatus also includes a time derivative circuit 13 in which the rate of change of the binary number representing the angular displacement of the vector R is obtained and provided as a binary number. Successive values of the binary number represent successive deviations in frequency of the carrier and correspond to successive levels of the modulating signal. The apparatus 10 also includes a digital-to-analog converter 14 which converts successive binary numbers obtained from the time derivative circuit into corresponding analog levels representing the modulating signal.

Figure 2:
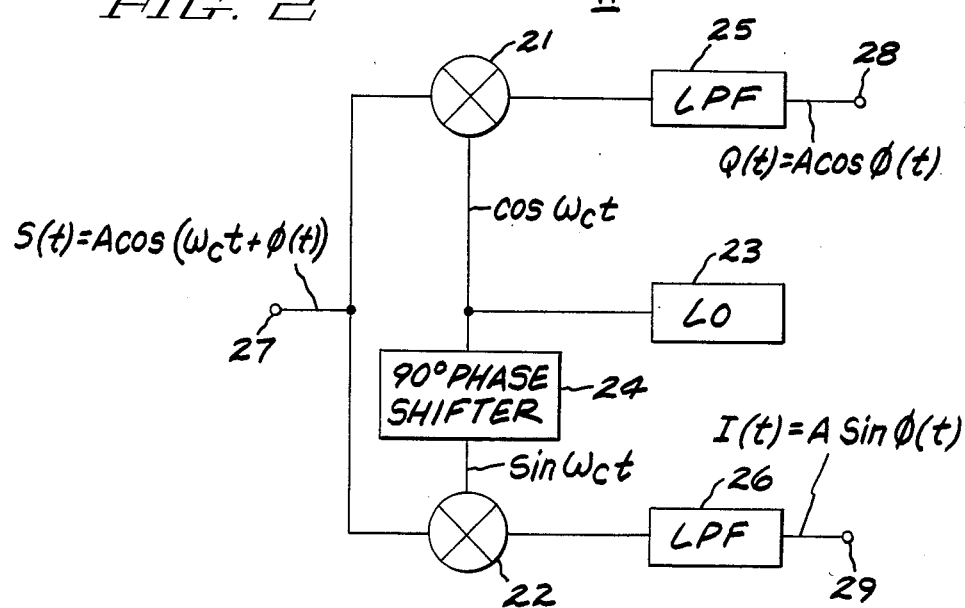
FIG. 2 shows a block diagram of the quadrature detector circuit of FIG. 1.

Reference is now made to FIG. 2 which shows a block diagram of the quadrature detector circuit 11 of FIG. 1. The quadrature detector circuit 11 includes a first mixer 21, a second mixer 22, a local oscillator which provides at its output a signal $\cos \omega_c t$, a 90° phase shifter 24 and a first low pass filter 25 and a second low pass filter 26. Quadrature detector circuit 11 also includes an input terminal 27 and output terminals 28 and 29. Input terminal 27 is connected to a first input terminal of first mixer 21 and a first input terminal of the second mixer 22. The output of the local oscillator 23 is connected to a second input terminal of first mixer 21 and is also connected to a second input terminal of the second mixer through a 90° phase shifter 24 which shifts the phase of the signal from the local oscillator 23 by 90°. The output of the first mixer 21 is connected through low pass filter 25 to output terminal 28. The output of the second mixer 22 is connected to low pass filter 26 to the output terminal 29. A frequency modulated signal S(t) as set forth in equation (1) is applied at input terminal 27. The frequency modulation signal is multiplied or mixed in the first mixer 21 with the signal $\cos \omega_c t$ from the local oscillator 23 to produce at the output terminal thereof the signal set forth in equation (2). The frequency modulated signal is also mixed with the phase shifted signal $\sin \omega_c t$ in the second mixer 22 to provide at its output terminal the signal set forth in equation (3). The low pass filter 25 filters the double reference frequency component of the signal of equation (2) and provides at output terminal 28 the signal of equation (5). Similarly, the low pass filter 26 filters the double reference frequency component of the signal of equation (3) and provides at output terminal 29 the signal I(t) set forth in equation (4).

Figure 3:
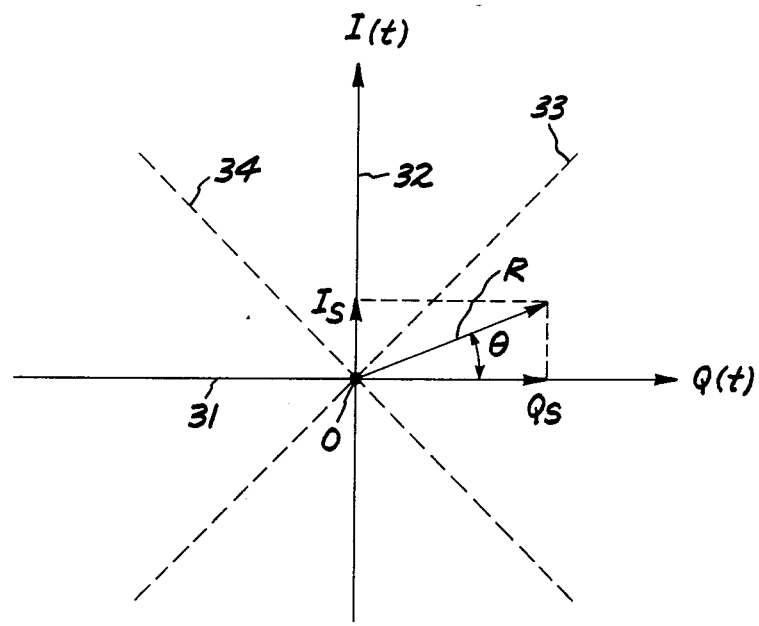
FIG. 3 shows a rectangular coordinate system superimposed on a polar coordinate system useful in explaining the operation of the invention.

Reference is now made to FIG. 3 which shows a rectangular coordinate system with a horizontal coordinate axis 31 and a vertical coordinate axis 32 passing through an origin. The equations (4) and (5) define a vector R of amplitude A rotating in a counterclockwise direction about the origin. At time t the vector R makes an angle $\theta$ with the horizontal axis 31. The function I(t)=A sin $\phi$(t) is represented by the projection of the vector R onto the vertical axis and function Q(t)=A cos $\phi$(t) is represented by the projection of the vector R onto the horizontal axis. Dotted line 33 making an angle of 45° with the horizontal axis 31 divides each of the first and third quadrants into a pair of octants. Similarly, the dotted line 34 making an angle of 135° with respect to the horizontal axis 31 divides each of the second and fourth quadrants into a pair of octants.

Figure 4:
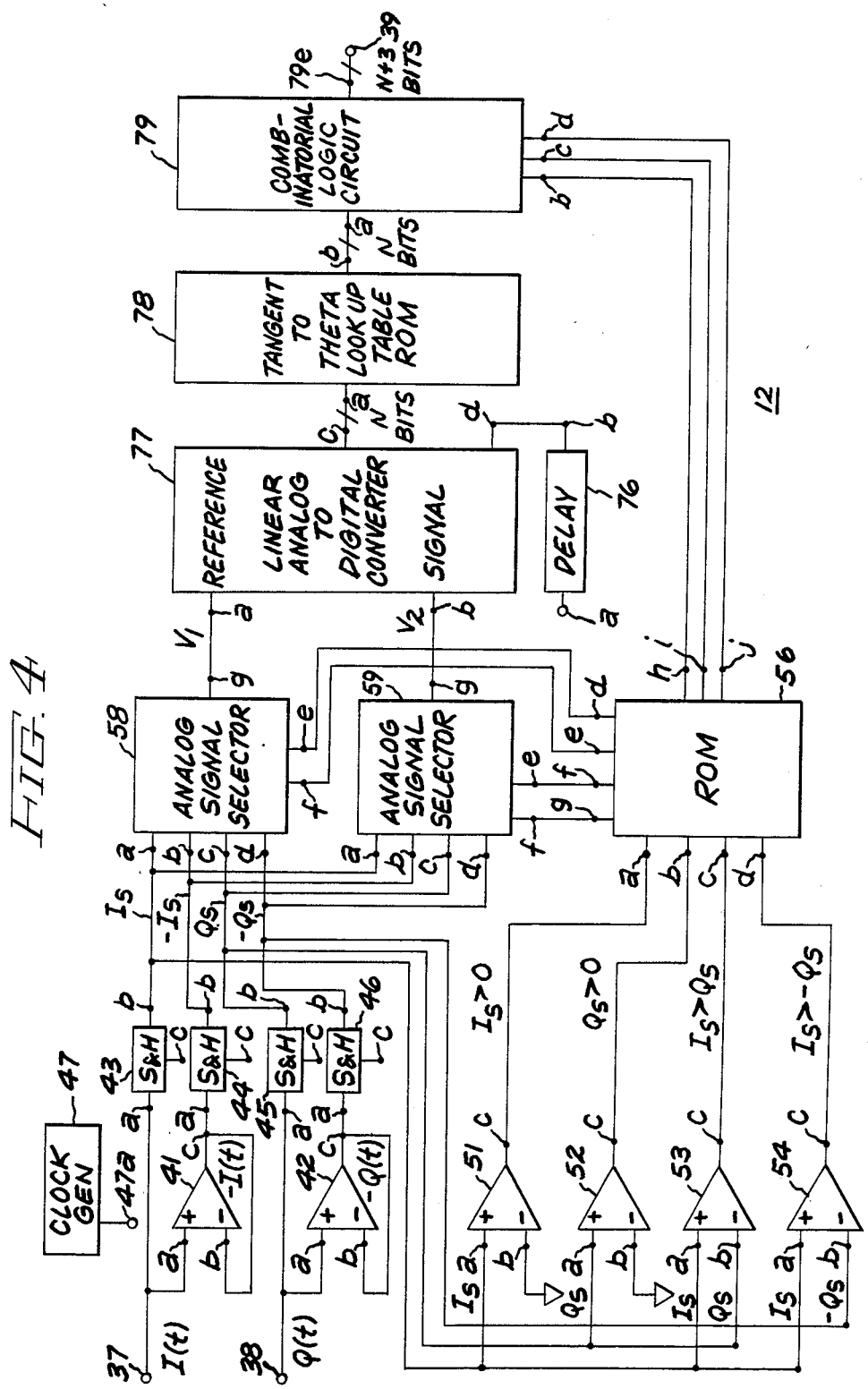
FIG. 4 shows a block diagram of the arctangent analog-to-digital converter of FIG. 1.

Reference is now made to FIG. 4 which shows a block diagram of the arctangent analog-to-digital converter 12 of FIG. 1. The arctangent analog-to-digital converter 12 includes an input terminal 37 to which is applied the signal I(t), an input terminal 38 to which is applied the signal Q(t), and an output terminal 39 in the form of a plurality of lines on which bits are obtained representing a binary number corresponding to the angle $\theta$. The converter 12 includes a first inverter 41 for inverting the I(t) signal supplied to terminal 37 to provide the signal −I(t). The inverter 41 in the form of an operational amplifier has noninverting input terminal 41a, an inverting input terminal 41b and an output terminal 41c. The input terminal 41a is connected to terminal 37. The input terminal 41b is connected to output terminal 41c. A second inverter 42 is provided for inverting the Q(t) signal applied to terminal 38 to provide the signal −Q(t). The inverter 42 in the form of an operational amplifier includes noninverting input terminal 42a, inverting input terminal 42b and an output terminal 42c. Input terminal 42a is connected to terminal 38. Inverting input terminal 42b is connected to output terminal 42c. Operational amplifiers may be type LM741 made by National Semiconductor Corp. of Santa Clara, Calif.

The converter 12 also includes sample and hold circuits 43–46 which sample and hold respective signals I(t), −I(t), Q(t) and −Q(t) to provide respective sample signals $I_s$, $-I_s$, $Q_s$ and $-Q_s$. Sample and hold circuit 43 includes an input terminal 43a and an output terminal 43b and a clocking terminal 43c. Input terminal 3a is connected to terminal 37. Clocking terminal 43c is connected to terminal 47a of clock generator 47. Sample and hold circuit 44 includes input terminal 44a, output terminal 44b and clocking terminal 44c. Input terminal 44a is connected to output terminal 41c. Clocking terminal 44c is connected to terminal 47a of clock generator 47. Sample and hold circuit 45 includes an input terminal 45a, an output terminal 45b and a clocking terminal 45c. Input terminal 45a is connected to terminal 38, clocking terminal 45c is connected to terminal 47a. Sample and hold circuit 46 includes an input terminal 46a, an output terminal 46b and a clocking terminal 46c. Input terminal 46a is connected to output terminal 42c of converter 42. Clocking terminal 46c is connected to terminal 47a. The sample and hold circuits 43–46 may be sample and hold circuit type SHM5 made by Datel of Mansfield, Mass.

The converter 12 also includes comparators 51, 52, 53 and 54 which make four comparisons on each set of the signal samples $I_s$, $Q_s$ and $-Q_s$ to be described below to establish the octant in which a respective vector R corresponding to the set of signal samples is located. Comparator 51 compares the sample $I_s$ to ground and provides at its output a 1 bit if $I_s$ is greater than ground or zero and a 0 bit if $I_s$ is not greater than zero. Comparator 52 compares the sample $Q_s$ to ground and provides at its output a 1 bit if $Q_s$ is greater than ground or zero and a 0 bit if $Q_s$ is not greater than zero. Comparator 53 compares the sample $I_s$ and the sample $Q_s$ and provides at its output a 1 bit if $I_s$ is greater than $Q_s$ and a 0 bit if $I_s$ is not greater than $Q_s$. Comparator 54 compares the sample $I_s$ and the sample $-Q_s$ and provides at its output a 1 bit if $I_s$ is greater than $-Q_s$ and a 0 bit if $I_s$ is not greater than $-Q_s$. The location of an R vector in each of the octants is determined by a respective unique set of four output bits, one from each of the comparators 51–54. The unique sets of four bits appears in columns a, b, c, and d of Table 1 to be described below. The octant location from 0 to 7 of the vector R for each unique set of four bits appears in columns h, i, and j of Table 1. Comparator 51 has an input terminal 51a, an input terminal 51b and an output terminal 51c. Terminal 51a is connected to terminal 43b of sample and hold circuit 43. Terminal 51b is connected to ground. Comparator 52 has an input terminal 52a and input terminal 52b and an output terminal 52c. Input terminal 52a is connected to output terminal 45b of sample and hold circuit 45. Input terminal 52b is connected to ground. Comparator 53 has an input terminal 53a, and input terminal 53b and an output terminal 53c. Input terminal 53a is connected to terminal 43b. Input terminal 53b is connected to terminal 45b. Comparator 54 has an input terminal 54a, an input terminal 54b and an output terminal 54c. Terminal 54a is connected to terminal 43b, terminal 54b is connected to terminal 46b.

The converter 12 also includes a ROM (read only memory) 56 in which eight words each seven bits in length are stored. Each word is accessed by a respective one of the eight unique four-bit words obtained at the output of the comparators 51–54. The four bit words are applied to the address terminals 56a, 56b, 56c and 56d of the ROM 56. Two bits of a seven bit word stored in the ROM are available at terminals 56d and 56e and provide the function of selecting the largest signal sample $V_1$ of the four samples $I_s$, $-I_s$, $Q_s$ and $-Q_s$ to be utilized in obtaining a number in binary format representing the tangent of an angle less than 45°. This selection process is performed in analog signal selector 58 which will be described below. Two bits of the seven bit word are accessed at terminals 56f and 56g and are utilized to select the smallest positive sample $V_2$ of the signal samples $I_s$, $-I_s$, $Q_s$ and $-Q_s$ to be utilized in obtaining a number in binary format representing the tangent of an angle less than 45°. This selection process is performed in analog signal selector 59 which will be described below. Three bits of the seven bit word are available at terminals 56h, 56i and 56j. The three bits represent a number from zero to seven correspoonding to the octant in which the vector R is located. The angle $\theta$ of the vector R in any octant can be expressed as the angle of an integral number of octants to or from which an angle less than an octant or 45° is added or subtracted depending on whether the integral number of octants is odd or even. The angle less than 45° in some of the octants is constituted of samples of negative sign. Accordingly, in order to be able to uniformly calculate all such angles less than 45° regardless of octant location, it is necessary to select positive samples. Selecting the largest positive sample and the smallest positive sample provides the signals for this purpose. The analog signal selector 58 is provided to select the largest positive sample from among a set of samples $I_s$, $-I_s$, $Q_s$ and $-Q_s$. The analog signal selector 59 is provided to select the smallest positive signal sample from among the set of samples $I_s$, $-I_s$, $Q_s$ and $-Q_s$. Terminal 56a is connected to terminal 51c, terminal 56b is connected to terminal 52c. Terminal 56c is connected to terminal 53c. Terminal 56d is connected to terminal 54c. ROM 56 may be ROM type 2716 made by Intel Corporation of Santa Clara, Calif.

TABLE 1

| | | | | | | BITS AT TERMINALS OF ROM 56 | | | | | $V_1$-Voltage at 58 g | $V_2$-Voltage at 59 g |
|---|---|---|---|---|---|---|---|---|---|---|---|---|
| a | b | c | d | j | i | h | g | f | e | d | | |
| 1 | 1 | 0 | 1 | 0 | 0 | 0 | 1 | 1 | 1 | 0 | $Q_s$ | $I_s$ |
| 1 | 1 | 1 | 1 | 0 | 0 | 1 | 1 | 0 | 1 | 1 | $I_s$ | $Q_s$ |
| 1 | 0 | 1 | 1 | 0 | 1 | 0 | 0 | 0 | 1 | 1 | $I_s$ | $-Q_s$ |
| 1 | 0 | 1 | 0 | 0 | 1 | 1 | 1 | 1 | 0 | 0 | $-Q_s$ | $I_s$ |
| 0 | 0 | 0 | 0 | 1 | 0 | 0 | 1 | 0 | 0 | 0 | $-Q_s$ | $-I_s$ |
| 0 | 0 | 1 | 0 | 1 | 0 | 1 | 0 | 0 | 0 | 1 | $-I_s$ | $-Q_s$ |
| 0 | 1 | 0 | 1 | 1 | 1 | 0 | 0 | 1 | 0 | 1 | $-I_s$ | $Q_s$ |
| 0 | 1 | 0 | 0 | 1 | 1 | 1 | 0 | 1 | 1 | 0 | $Q_s$ | $-I_s$ |

Reference is now made to Table 1 which shows columns of bits each for a respective one of the input and output terminals of ROM 56. The bits appearing in each row represent bits simultaneously appearing at the terminals of the ROM 56. Thus, for each 4-bit word applied to the input terminals of ROM 56, a respective set of seven bits is obtained at the output terminals of the ROM 56, as shown. Table 1 also includes columns of voltages appearing at the output terminals 58g and 59g of respective signal selectors 58 and 59 to be described below in response to bits applied thereto from ROM 56. The largest positive signal sample $V_1$ appears at terminal 58g. The smallest positive signal sample $V_2$ appears at terminal 59g.

Figure 5:
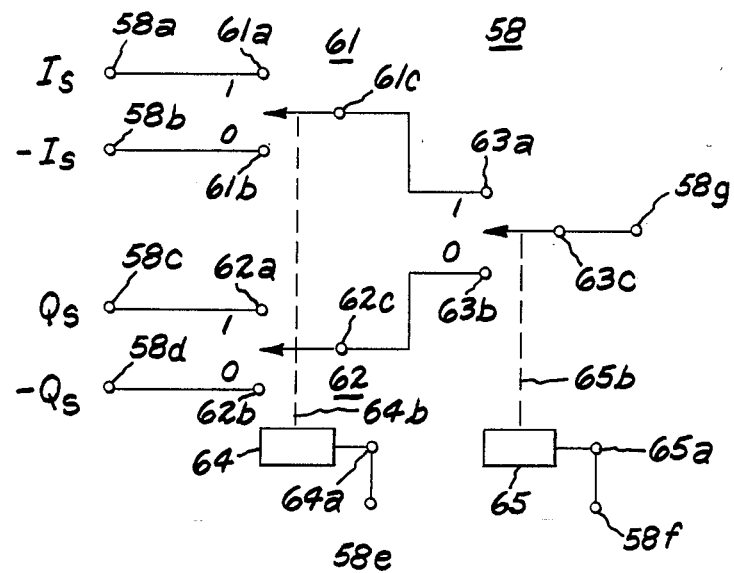
FIG. 5 shows a schematic diagram of the analog signal selector 58 of FIG. 4.

Converter 12 also includes analog signal selector 58 having input terminals 58a, 58b, 58c, 58d, 58e and 58f and an output terminal 58g. Terminal 58a is connected to terminal 43b, terminal 58b is connected to terminal 44b, terminal 58c is connected to terminal 45b, terminal 58d is connected to terminal 46b, terminal 58e is connected to terminal 56d, terminal 58f is connected to terminal 56e. Signals $I_s$, $-I_s$, $Q_s$, $-Q_s$ are applied to respective terminals 58a, 58b, 58c and 58d. Control bits from terminals 56d and 56e are applied to respective terminals 58e and 58f. Signal $V_1$ representing the largest positive signal sample of the set of samples $I_s$, $-I_s$, $Q_s$ and $-Q_s$ is obtained at terminal 58g. The analog signal selector 58 is also shown in FIG. 5 implemented by an assemblage of switches for reasons of simplicity of description. The analog signal selector 58 includes switches 61, 62 and 63. Switch 61 has a first contact 61a, a second contact 61b and a pole contact 61c. Switch 62 has a first contact 62a, a second contact 62b and a pole contact 62c. Switch 63 has a first contact 63a, a second contact 63b and a pole contact 3c. Terminal 58a is connected to first contact 61a. Terminal 58b is connected to second contact 61b. Terminal 58c is connected to contact 62a. Terminal 58d is connected to contact 62b. Contact 61c is connected to contact 63a. Contact 62c is connected to contact 63b. Contact 63c is connected to terminal 58g. The selector 58 also includes a controller 64 having an input terminal 64a and a linkage indicated by the dotted line 64b connected to the pole of switches 62 and 63 for controlling the position thereof in response to a control signal at terminal 64a. Terminal 64a is connected to terminal 58e. When a 1 bit is supplied to the input terminal 64a, the poles of the switches 61 and 62 contact respective first contact 61a and 62a thereof indicated by a 1 adjacent these contacts. When a 0 bit is applied to the input terminal 64a of the controller, the poles of switches 61 and 62 contact respective second contacts 61b and 62b thereof indicated by a 0 adjacent the contacts. The selector also includes controller 65 having an input terminal 65a and a linkage indicated by the dotted line 65b connected to the pole of switch 63 for controlling the position thereof in response to the control signal of terminal 65a. Terminal 65a is connected to terminal 58f. When a 1 bit is applied to the input terminal 65a, the pole of the switch 63 contacts first contact 63a thereof indicated by a 1 adjacent the contact. When a 0 bit is applied to the input terminal 65a, the pole of switch 63 contacts second contact terminal 63b thereof indicated by a 0 adjacent the contact. Thus, when the ROM 56 is addressed by the word 0000, i.e., when zero bits are applied input terminals 56a, ;56b, 56c and 56d, a set of bits 00 appear at terminals 58e and 58f (See Table 1) thereby causing the poles of switches 61 and 62 to contact respective second contacts 61b and 62b and the pole of switch 63 to contact second terminal 63b and making available the sample $-Q_s$ at the output terminal 58g.

Figure 6:
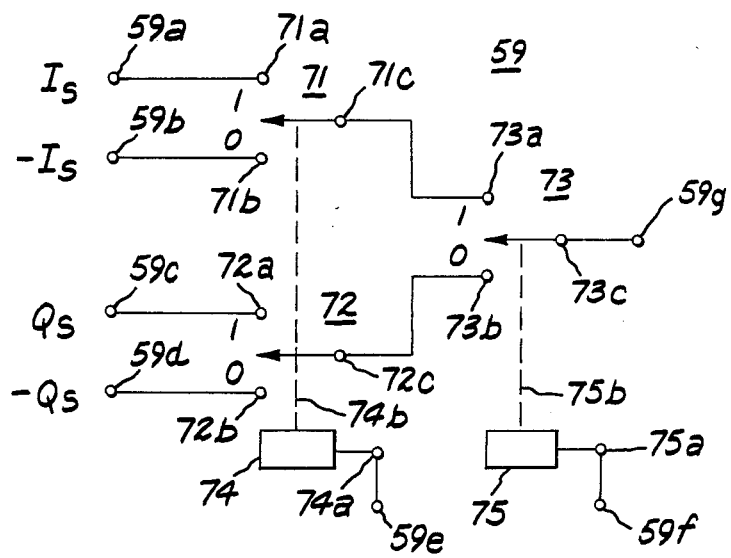
FIG. 6 shows a schematic diagram of the analog signal selector 59 of FIG. 4.

Converter 12 includes analog signal selector 59 having input terminals 59a, 59b, 59c, 59d, 59e and 59f and an output terminal 59g. Terminal 59a is connected to terminal 43b, terminal 59b is connected to terminal 44b, terminal 59c is connected to terminal 45b, terminal 59d is connected to terminal 46b, terminal 59e is connected to terminal 56f, terminal 59f is connected to terminal 56g. Signals $I_s$, $-I_s$, $Q_s$, $-Q_s$ are applied to respective terminals 59a, 59b, 59c and 59d. Control bits from terminals 56f and 56g are applied to respective terminals 59e and 59f. Signal $V_2$ repesenting the smallest positive signal sample of the set of samples $I_s$, $-I_s$, $Q_s$ and $-Q_s$ is obtained at terminal 59g. The analog signal selector 59 is shown in FIG. 6 implemented by an assemblage of switches for reasons of simplicity of description. The analog signal selector 59 includes switches 71, 72 and 73. Switch 71 has a first contact 71a, a second contact 71b and a pole contact 71c. Switch 72 has a first contact 72a, a second contact 72b and a pole contact 72c. Switch 73 has a first contact 73a, a second contact 73b and a pole contact 73c. Terminal 59a is connected to first contact 71a. Terminal 59b is connected to second contact 71b. Terminal 59c is connected to contact 72a. Terminal 59d is connected to contact 72b. Contact 71c is connected to contact 73a. Contact 72c is connected to contact 73b. Contact 73c is connected to terminal 59g. The selector 59 also includes a controller 74 having an input terminal 74a and a linkage indicated by the dotted line 74b connected to the pole of switches 71 and 72 for controlling the position thereof in response to a control signal at terminal 74a. Terminal 74a is also connected to terminal 59e. When a 1 bit is supplied to the input terminal 74a, the poles of the switches 71 and 72 contact respective first contact 71a and 72a thereof indicated by a 1 adjacent these contacts. When a 0 bit is applied to the input terminal 74a of the controller, the poles of switches 71 and 72 contact respective second contacts 71b and 72b thereof indicated by a 0 adjacent the contacts. The selector also includes controller 75 having an input terminal 75a and a linkage indicated by the dotted line 75b connected to the pole of switch 73 for controlling the position thereof in response to the control signal of terminal 75a. Terminal 75a is connected to terminal 59f. When a 1 bit is applied to the input terminal 75a, the pole of the switch 73 contacts first contact 73a thereof indicated by a 1 adjacent the contact. When a 0 bit is applied to the input terminal 74a, the pole of switch 63 contacts second contact terminal 73b thereof indicated by a 0 adjacent the contact. Thus, when the ROM 56 is addressed by the word 0000, i.e., when zero bits are applied to input terminals 56a, 56b, 56c and 58d, a set of bits 0 and 1 appear at respective terminals 59e and 59f (see Table 1) thereby causing the poles of switches 71 and 72 to contact second respective contacts 71b and 72b and the pole of switch 73 to contact first contact 73a and making available the sample $-I_s$ at the output terminal 59g.

The converter 12 also includes a linear analog-to-digital converter 77 for converting the ratio of the smallest positive sample $V_2$ obtained from analog signal selector 59 to the largest positive sample obtained from analog signal selector 58 into a binary number k of N bits representing the tangent of an angle less than 45°. If N is set equal to 8, k would be a number from 0 to 255. The analog-to-digital converter 77 includes an input terminal 77a referred to as the reference terminal and input terminal 77b referred to as the signal terminal and an output terminal 77c collectively representing terminals at which the N bits of the digital word are obtained and a clocking terminal 77d. Terminal 77a is connected to terminal 58g. Terminal 77b is connected to terminal 59g. Clocking terminal 77d is connected to the output terminal 76b of delay line 76, the input terminal 76a of which is connected to terminal 47a of clock generator 47. The delay line 76 provides a sufficient delay (about 1 microsecond) in the application of timing signals from the clock generator 47 to the analog to digital converter to allow for the time required to process a set of samples up to the inputs to the analog to digital converter. Analog to digital converter 77 may be Analog to Digital Converter type 8ADC826MC made by Datel Corporation of Mansfield, Mass.

The converter 12 also includes a tangent to theta lookup table ROM 78 for providing for each tangent number obtained from the analog-to-digital converter 77 a respective binary number of N bis representing the arctangent thereof. The tangent to theta lookup table ROM 78 includes an input terminal 78a collectively representing N terminals, an output terminal 78b collectively representing N terminals. The input terminal 78a is connected to output terminal 77c. The ROM 78 may be a ROM type 2716 made by Intel Corporation of Santa Clara, Calif.

The converter 12 also includes a combinatorial logic circuit 79 for combining each number obtained from the tangent to theta lookup table ROM 78 with a respective number from ROM 56 to provide a number representing the angle θ corresponding to a respective set of signal samples. The combinatorial logic circuit 79 includes an input terminal 79a collectively representing N terminals, an input terminal 79b connected to terminal 56h, an input terminal 79c connected to terminal 56, an input terminal 79d connected to terminal 56j and an output terminal 79e collectively representing N+3 terminals. Output terminal 79e is connected to terminal 39.

Reference is now made to FIG. 7 which shows a schematic diagram of the combinatorial logic circuit 79 of FIG. 4. The circuit 79 includes eleven input terminals designated 79-1 through 79-11 and eleven output terminals 79-1' through 79-11'. The circuit also includes eight Exclusive-OR gates 81-88 each having a pair of input lines and an output line. One of the input lines of each of the gates is connected to a respective one of input terminals 79-1 through 79-8. The other input line of each of the gates is connected to input terminal 79-9. Each of the output lines of the gates is connected to a respective one of output terminals 79-1' through 79-8'. Input terminals 79-9 through 79-11 are connected to respective output terminals 79-9' through 79-11'. Input terminals 79-1 through 79-8 are connected to the output of ROM 78. Input terminals 79-9 through 79-11 are connected to respective output terminals 56h through 56j of ROM 56. The least significant bits of the input to combinatorial logic circuit 79 appear at terminals 79-1 through 79-8. The most significant bits of the input appear at the terminals 79-9 through 79-11. At the output terminals 79-1' through 79-11' is obtained a binary number representing the angle θ.

TABLE 2

| Number from ROM 56 | Number from ROM 78 | Number from Circuit 79 |
|---|---|---|
| 0 0 0 | k | 0 + k |
| 0 0 1 | k | 512 − k |
| 0 1 0 | k | 512 + k |
| 0 1 1 | k | 1024 − k |
| 1 0 0 | k | 1024 + k |
| 1 0 1 | k | 1536 − k |
| 1 1 0 | k | 1536 + k |
| 1 1 1 | k | 2048 − k |

The operation of the circuit of FIG. 7 will be apparent from Table 2 to which reference is now made. Table 2 shows in a first column the binary numbers 000 to 111 provided by ROM 56, each for a respective one of eight octants and also shows in a second column a number k obtained from ROM 78. It is assumed that number N representing the bits in the output ROM 78 is 8. Accordingly, the number k has a range of 0–255 and each octant is represented by the number 256. The third column of Table 2 shows whether the number k is to be added to or subtracted from quandrant numbers. The subtraction operation is performed when the least significant bit of the number in column 1 is a 1. As this least significant bit is applied to one of the inputs of the Exclusive—OR gates 81-88, at the output of the Exclusive—OR gates is obtained the complement of the number k which is added to a number 256 units less than the number from which k is to be subtracted.

Reference is now made to FIG. 8 which shows a block diagram of the time derivative circuit 13 of FIG. 1. The time derivative circuit 13 includes a shift register 91 having an input terminal 91a collectively representing eleven terminals, an output terminal 91b collectively representing eleven terminals and a clocking terminal 91c. The shift register 91 includes eleven channels each having a single stage. The time derivative circuit 13 also includes a subtraction circuit 92 having a first input terminal 92a collectively representing eleven terminals, a second input terminal 92b collectively representing eleven terminals and an output terminal 92c collectively representing eleven terminals. The input terminal 91a of shift register 91 is connected to the output terminal 39 of the arctangent to digital converter 12. The input terminal 91a is also connected to input terminal 92b of subtraction cicuit 92. The output terminal 91b is connected to input terminal 92a of subtraction circuit 92. Clock terminal 91c is connected to terminal 47a of clock generator 47.

In operation, a sequence of numbers representing a sequence of values of the angle $\theta$ appearing at input terminal 91a is delayed in shift register 91 by one clock cycle and appears at output terminal 91b. The subtraction circuit 92 subtracts each number appearing at the output terminal 91b from a respective number appearing concurrently at the input terminal 91a. A sequence of the difference in two concurrent numbers is obtained at the output of terminal 92c of the subtraction circuit. Each difference represents the $\Delta\theta$ in value of the angle $\theta$ over the period $\Delta t$ of a clock cycle of the shift register 91. Each difference corresponds to a respective deviation frequency representing a respective amplitude level of the modulating signal.

Summarizing the operation of the FM detector of FIGS. 1-8, an FM signal from a source such as an RF amplifier is applied to the quadrature detector circuit 11 of FIGS. 1 and 2 and at the output thereof signals I(t) and Q(t) are obtained. The center frequency of the FM carrier, for example, would be about 100 MHz. The maximum deviation of the carrier in response to frequency modulation thereof would be about 75 KHz, and the signal modulating the carrier would have frequencies up to about 53 KHz. The maximum frequency of the I(t) and Q(t) signals would be 75 KHz.

The I(t) and Q(t) signals are applied to arctangent analog-to-digital converter 12 of FIGS. 1 and 4 and are inverted to provide $-I(t)$ and $-Q(t)$ signals. The signals I(t), $-I(t)$, Q(t) and $-Q(t)$ are sampled by sample and hold circuits 43 through 46 to provide signal samples $I_s$, $-I_s$, $Q_s$, and $-Q_s$. The sampling rate is under the control of clock generator 47. The sampling rate is set to be greater than twice the maximum deviation frequency of 75 KHz, for example, 228 KHz. The clock signal is applied to clocking terminals of linear analog-to-digital converter 77 of FIG. 4 and shift register 91 of FIG. 8.

At the output of the sample and hold circuis 43-46, a sequence of sets of signal samples $I_s$, $-I_s$, $Q_s$, and $-Q_s$ is obtained. Each set of samples is processed in sequence. Consider the processing of a single set of samples. Signal samples $I_s$, $-I_s$, $Q_s$, and $-Q_s$ are applied to comparators 51-54, to analog signal selector 58 and to analog signal selector 59. At the output of the comparators 51-54, a word of four bits is obtained identifying the location of the R vector of the signal sample in one of eight octants. The four bit word accesses the octant number from ROM 56 which is available as a three bit word at a set of output terminals of the ROM. The four bit word also accesses a first set of two bits utilized for signal selection control and a second set of two bits also utilized for signal selection control. In response to the first set of two bits supplied to analog signal selector 58, the largest signal sample from the set of samples is selected and appears as an analog sample $V_1$ at the output terminal of the analog signal selector. In response to the second set of two bits applied to the analog signal selector 59, the smallest positive sample among the set of samples is selected and appears at the output terminal thereof as voltage $V_2$. The voltage $V_1$ is applied to the reference terminal of linear analog-to-digital converter 77 and the signal sample $V_2$ is applied to the signal terminal of the converter 77. At the output of the analog-to-digital converter 77 is obtained an N bit number representing the ratio of the voltage $V_2$ to the voltage $V_1$ and corresponds to the tangent of an angle less than an octant or 45 degrees. The number obtained at the output of the converter 77 accesses a number in the tangent to theta lookup table ROM 78 which represents the arctangent thereof. The octant number otained at the output of ROM 56 corresponding to the set of signal samples is combined in the combinatorial logic circuit with the arctangent number obtained from ROM 78 to provide a number from 0 to 2047 representing the angle $\theta$ (0 to 359.824 degrees) of the vector R of the set of signal samples being processed. Thus, at the output of the arctangent analog-to-digital converter 12 is obtained a sequence of numbers, each of the numbers representing the angle $\theta$ for a respective set of signal samples. These numbers are applied to the time derivative circuit of FIG. 1 and FIG. 8 to obtain a sequence of numbers each representing the rate of change of the angle $\theta$ of the signals I(t) and Q(t). The rate of change of the angle $\theta$ corresponds to the frequency deviation of the carrier. The binary numbers representing the frequency deviation are converted into analog signal samples by the digital to analog converter 14. The output of the digital to analog converter is the modulating signal.

While in the analog signal selectors 58 and 59 the switching or multiplexing functions have been implemented for reasons of simplicity of description by assemblages of switches, such assemblages of switches can be completely implemented by semiconductor devices, as is well known to those skilled in the art.

While the invention has been described in a specific embodiment, it will be understood that modifications, such as those described above, may be made by those skilled in the art and it is intended by the appended claims to cover all such modifications and changes as fall within the true spirit and scope of the invention.

What is claimed is:

1. A detector for recovering a modulating signal from a carrier modulated in frequency by the modulating signal comprising means for generating first and second signals in phase quadrature and at a reference frequency substantially equal to the center frequency of said carrier, means responsive to said phase-quadrature reference signals for converting the frequency modulated carrier into first and second baseband signals, means for filtering the double reference frequency component of the first and second baseband signals to provide respective I and Q signals, the I and Q signals constituting in rectangular coordinates components of a vector represented in polar coordinates by R and $\theta$, where R is the maximum amplitude of I and Q signals and $\theta$ is the instantaneous angle represented by the arctangent of the I signal divided by the Q signal, means for inverting said I signal and said Q signal to provide respective $-I$ and $-Q$ signals, means for sampling said I, $-I$, Q and $-Q$ signals at a frequency greater than twice the maximum deviation in frequency of said carrier produced by said modulating signal to obtain a sequence of sets of samples of said I, $-I$, Q, and $-Q$ signals, each set of samples being represented by a respective vector R and a respective angle $\theta$ consisting of a first angle component equal to zero or an integral number of octants and a second angle component less than an octant which is added to or subtracted from said first angle component depending on whether the vector R is in an odd or even octant, first conversion means responsive to each of said sets of signal samples for providing a respective first binary number from 000 to 111 representing the first angle component of a respective angle $\theta$, second conversion means responsive to each of said sets of signal samples for providing a respective second binary number representing the second angle component of a respective angle $\theta$, means for combining the first binary number and the second binary number of each of said sets of samples to obtain a respective third binary number representing the respective angle $\theta$ thereof, means for obtaining a sequence of changes in the value of said third binary numbers of successive sets of said sequence of sets of I, $-$I, Q, and $-$Q signal samples, said sequence of changes representing changes in frequency of said carrier from the center frequency thereof corresponding to changes in amplitude of said modulating signal, means for converting each number of said sequence of changes in the value of successive third binary numbers into a respective amplitude level whereby said modulating signal is recovered.

2. The detector of claim 1 in which said first conversion means includes, a first comparator means respective to said I signal samples for developing a binary 1 when an I signal sample is greater than 0 and binary 0 when an I signal sample is not greater than 0, a second comparator means respective to said Q signal samples for developing a binary 1 when a Q signal sample is greater than 0 and a binary 0 when a 0 signal sample is not greater than 0, a third comparator means respective to said I and Q signal samples of a set of samples for developing a binary 1 when an I signal sample is greater than a Q signal sample and a binary 0 when an I signal sample is not greater than a Q signal sample, a fourth comparator means responsive to said I signal sample and said $-$Q signal sample of a set of samples for developing a binary 1 when an I signal sample is greater than a $-$Q signal sample and for developing a binary 0 when an I signal sample is not greater than a $-$Q signal sample, the location of a vector R corresponding to a set of signal samples and the angular displacement $\theta$ thereof in an octant of said polar coordinate system being determined by a respective unique set of four output bits, one from each of said comparators, p0 means respective to each unique set of four output bits from said comparators for providing a respective said first binary number from 000 to 111, and in which said second conversion means includes, means respective to each of said unique sets of four bits to provide to a respective first set of two bits for controlling the selection of the largest positive signal sample of a set of I, $-$I, Q, $-$Q signal samples, a first analog signal selector for selecting the largest positive sample of each set of I, $-$I, Q and $-$Q signal samples in response to a respective first set of two bits, means responsive to each of said unique sets of four bits to provide a respective second set of two bits for controlling the selection of the smallest positive signal sample of a set of I, $-$I, Q, $-$Q signal samples, a second analog signal selector for selecting the smallest positive sample of each set of I, $-$I, Q, and $-$Q signal samples in response to a respective second set of binary bits, means for converting the smallest positive sample and the largest positive sample of each set of signal samples into a first binary number representing the ratio thereof and corresponding to the tangent of an angle less than an octant, means for obtaining for each of said first binary numbers a respective second binary number representing said angle less than an octant.

3. A detector for recovering a modulating signal from a carrier modulated in frequency by the modulating signal comprising:

means for generating first and second signals in phase quadrature and at a reference frequency substantially equal to the center frequency of said carrier, means responsive to said phase-quadrature reference signals for converting the frequency modulated carrier into first and second baseband signals, means for filtering the double reference frequency component of the first and second baseband signals to obtain respective I and Q signals, said I and Q signals constituting in rectangular coordinates the components of a vector represented in polar coordinates by R and $\theta$, where R is the maximum amplitude of I and Q signals and $\theta$ is the instantaneous angle represented by the arctangent of the I signal divided by the Q signal, means for inverting said I signal and said Q signal to provide respective $-$I and $-$Q signals, means for sampling said I, $-$I, Q and $-$Q signals at a frequency greater than twice the maximum deviation in frequency of said carrier produced by said modulating signal to obtain a sequence of sets of I, $-$I, Q, and $-$Q signal samples, means for deriving from said sequence of sets of I, $-$I, Q and $-$Q signal samples a sequence of values of the angle $\theta$, each value of the angle $\theta$ corresponding to a respective set of I, $-$I, Q and $-$Q signal samples, means for deriving from said sequence of values of the angle $\theta$ a sequence of changes in the value of the angle $\theta$ of successive sets of said sequence of sets of I, $-$I, Q and $-$Q signal samples, said sequence of changes in the value of the angle $\theta$ representing changes in frequency of said carrier from the center frequency thereof corresponding to changes in amplitude of said modulating signal, whereby said modulating signal is recovered.

4. The detector of claim 3 in which each value of said sequence of values of the angle $\theta$ is derived as a binary number, in which each change in value of said sequence of changes in value of successive binary numbers of said sequence of binary numbers of the angle $\theta$ is derived as a binary number, and in which means are provided for converting said sequence of changes in binary values into analog values.

5. The detector of claim 2 in which said means responsive to each unique set of four output bits from said comparators for providing a respective octant number from 000 to 111 comprises a read only memory.

6. The detector of claim 2 in which said means responsive to each of said unique sets of four bits to provide a respective first set of two bits, and a respective second set of two bits comprises a read only memory.

7. The detector of claim 2 in which said means for converting the smallest positive sample and the largest positive sample of each set of signal samples into a binary number representing the ratio thereof and corresponding to the tangent of an angle less than an octant comprises an analog to digital converter.

8. The detector of claim 2 in which said means for obtaining for each of said first binary numbers a respective second binary number representing said angle less than an octant comprises a read only memory.

* * * * *